United States Patent [19]

Kuo

[11] Patent Number: 4,758,988
[45] Date of Patent: Jul. 19, 1988

[54] DUAL ARRAY EEPROM FOR HIGH ENDURANCE CAPABILITY

[75] Inventor: Clinton C. K. Kuo, Austin, Tex.

[73] Assignee: Motorola, Inc., Schaumburg, Ill.

[21] Appl. No.: 808,909

[22] Filed: Dec. 12, 1985

[51] Int. Cl.[4] .................. G11C 7/00; G11C 11/34; G11C 11/40

[52] U.S. Cl. .................. 365/189; 365/185; 365/200

[58] Field of Search ............ 365/189, 218, 200, 230, 365/185, 94, 103, 51, 184; 371/36

[56] References Cited

U.S. PATENT DOCUMENTS

| | | | |
|---|---|---|---|
| 3,681,578 | 8/1972 | Stevens | 371/36 |
| 3,783,250 | 1/1974 | Fletcher et al. | 371/36 |
| 4,044,341 | 8/1977 | Stewart et al. | 365/203 |
| 4,408,305 | 10/1983 | Kuo | 365/230 X |
| 4,412,309 | 10/1983 | Kuo | 365/218 X |
| 4,486,859 | 12/1984 | Hoffman | 365/218 X |
| 4,580,247 | 4/1986 | Adam | 365/200 |
| 4,630,085 | 12/1986 | Koyama | 365/185 X |
| 4,656,610 | 4/1987 | Yoshida et al. | 365/200 |

Primary Examiner—Stuart N. Hecker
Assistant Examiner—Alyssa Bowler
Attorney, Agent, or Firm—John A. Fisher; Jeffrey Van Myers; James L. Clingan, Jr.

[57] ABSTRACT

An EEPROM has two arrays which provide data in response to an address. The EEPROM can be programmed to function in one of two modes. The EEPROM can supply data from a selected one of the arrays or can simultaneously supply data from both arrays. In the mode in which data is supplied simultaneously from both arrays, the data from both arrays is coupled to a common data line where the data is sensed by a sense amplifier.

9 Claims, 4 Drawing Sheets

DUAL ARRAY EEPROM FOR HIGH ENDURANCE CAPABILITY

FIELD OF THE INVENTION

The present invention relates to electrically erasable programmable read only memories (EEPROMs), and more particularly, to techniques for providing high endurance EEPROMs.

BACKGROUND OF THE INVENTION

A characteristic of EEPROMs is that they have a finite number of times that they can be erased and programmed. For each time an EEPROM cell is erased and programmed, electrons are tunneled to and from a floating gate of the EEPROM. The floating gate is electrically isolated so it will remain charged indefinitely. After some number of times of erasing and programming, however, the charge will leak away so that the floating gate loses its charge. In the programmed state the floating gate is depleted by removing electrons from the floating gate so that it becomes positively charged. This causes the memory cell, a floating gate transistor, to have a lower threshold voltage. When the floating gate transistor has a low threshold voltage, the memory cell is conductive and recognized as a logic low. When the memory cell is unprogrammed (in the erased state), it has a higher threshold voltage and is characterized as having a high impedance which is recognized as a logic high. When the floating gate transistor will not stay programmed, it is because electrons leaked into the floating gate causing it to lose its charge. With the floating gate uncharged, the memory cell is a logic high.

It has been recognized, however, that all of the memory cells on a given integrated circuit chip do not have the same life expectancy with respect to the number of times they can be programmed and erased. This characteristic is known as endurance. There may be a relatively small number of memory cells which have low endurance. Once a single EEPROM cell begins failing due to losing its charge, the EEPROM is also failing even though a vast majority of the EEPROM cells are not losing their charge. One technique has been developed to compensate for a few weak cells causing the EEPROM as a whole to have low endurance. This technique provides two floating gate transistors at each memory cell location. For each access of a memory cell, two adjoining floating gate transistors are also accessed. The two adjoining floating gate transistors are connected in parallel. If one of the floating gate transistors cannot hold charge when programmed, perhaps the adjoining one will, thus extending the life of the EEPROM. This is effective because the failure mode is known to be to degrade to the high impedance state. If a memory location is programmed, conductivity is expected. Such conductivity will be provided if either floating gate transistor can hold its charge. If the logic low state is the desired state, even a faulty transistor will provide the desired high impedance. A faulty floating gate transistor provides the logic high state whether programmed or not programmed. Consequently, the endurance of the EEPROM is improved while not interfering with the desired functionality.

SUMMARY OF THE INVENTION

An object of the present invention is to provide an improved high endurance EEPROM.

Another object of the invention is to provide an EEPROM with an improved high endurance technique.

Yet another object of the invention is to provide an improved EEPROM which can be converted to a high endurance EEPROM.

These and other objects are achieved in an electrically erasable programmable read only memory (EEPROM) having memory cells selectively programmed to a low (depletion) threshold state or unprogrammed to a high (enhancement) threshold state. The EEPROM has a first array, a second array, a sense amplifier, and a decoder. The first and second arrays have memory cells located at intersections of word lines and bit lines. The sense amplifier receives inputs from a pair of selected memory cells and provides an output signal at a first logic state if both of the selected memory cells are in the high (enhancement) threshold state and at a second logic state if either or both of the selected memory cells are in the low (depletion) threshold state. The decoder couples a first selected memory cell from the first array as one of the memory cells of the selected pair of memory cells to the sense amplifier and couples a second selected memory cell from the second array as the other of the memory cells of the selected pair of memory cells to the sense amplifier.

DESCRIPTION OF THE INVENTION

Figure 1:
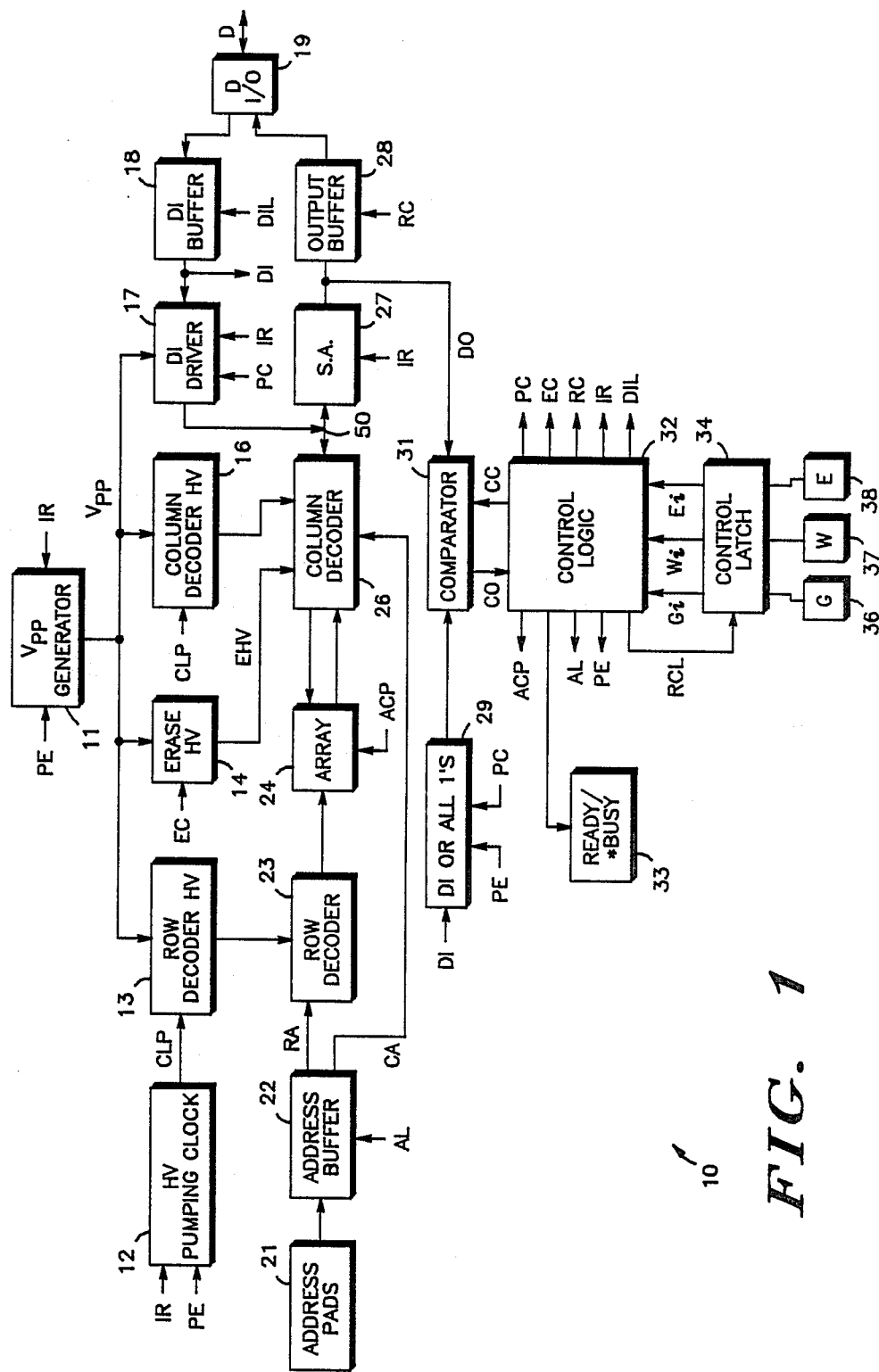
FIG. 1 is a combination block diagram and circuit diagram of an electrically erasable programmable read only memory according to a preferred embodiment of the invention.

Shown in FIG. 1 is an electrically erasable programmable read only memory (EEPROM) 10 comprised generally of a high voltage (Vpp) generator 11, a high voltage pumping clock 12, a row decoder high voltage generator 13, an erase high voltage generator 14, a column decoder high voltage generator 16, a data in driver 17, a data in buffer 18, data input/output (I/O) pads 19, address pads 21, an address buffer 22, a row decoder 23, a memory array 24, a column decoder 26, a sense amplifier 27, an output buffer 28, a data in or all ones switch 29, a comparator 31, a control logic circuit 32, a READY/*BUSY pad 33, a control latch 34, a control signal pad 36, a control signal pad 37, and a control signal pad 38.

Generator 11 generates a high voltage Vpp for programming or erasing data in array 24. High voltage Vpp is generated at about 20 volts when a program/erase signal PE is a logic high and an intelligent read signal IR is a logic low. Signal PE at a logic high indicates that memory 10 is in an erase mode or a program mode. There are three erase modes and two program modes. There is an array erase mode, a page erase mode, and a byte erase mode. In the array erase mode, all of array 24 is erased to the logic high state. In the byte erase mode, one selected byte (8 bits) is erased to the logic high state. There is a byte program mode and a bulk zero mode. In the byte program mode, predetermined bits in a selected byte are programmed to the logic low state. In the bulk zero mode, all of array 24 is programmed to the logic low state. These four states are known in the art. For more details concerning these modes of operation see U.S. Pat. No. 4,412,309, Kuo, entitled "EEPROM With Bulk Zero Program capability, issued Oct. 25, 1983.

High voltage Vpp is received by high voltage generators 13, 14, and 16 and by driver 17. Row decoder high voltage generator 13 has an output connected to row decoder 23. Generator 13 also has an input for receiving a clock pump signal CLP. Column decoder high voltage generator 16 also has an input for receiving clock pump signal CLP and an output connected to column decoder 26. Erase high voltage generator 14 has an output connected to column decoder 26 and an input for receiving erase control signal EC. Generator 14 couples Vpp to array 24 via column decoder 26 when signal EC is a logic high. When signal EC is a logic low, generator 11 supplies ground to column decoder 26. Pumping clock 12 provides clock signal CLP when signal PE is a logic high and signal IR is a logic low. Clock CLP is supplied concurrently with Vpp being supplied at a high voltage.

Array 24 is comprised of 131,072 EEPROM memory cells which are arranged in 16,384 bytes. This is generally known as a 128K EEPROM arranged as 16K×8. Each byte is connected to a set of 8 bit lines, one bit line for each bit in the byte. Each byte is connected to a word line which runs perpendicular to the bit lines. There is also an erase line for each byte which runs parallel to the bit lines. For each bit line set comprised of a set of 8 bit lines and a corresponding erase line, there is connected thereto many bytes. Likewise there are many bytes connected to each word line. A byte is accessed when the word line connected thereto is enabled and the bit lines coupled thereto are coupled to sense amplifier 27 via column decoder 26. Address pads 21 receive a row address RA and a column address CA. The row address determines the word line which is selected to be enabled. The column address determines which set of bit lines is coupled to sense amplifier 27 or data in driver 17. Address buffer 22 receives the address and latches the received address in response to an address latch signal AL switching to a logic high. Address buffer 22 provides row address RA to row decoder 23 and column address CA to column decoder 26. Row decoder 23 enables the word line which is selected by row address RA. Column decoder 26 couples the set of bit lines selected by address CA to a data line 50 which is used to output data to sense amplifier 27 or to receive data to be written from data in driver 17. Column decoder 26 is coupled to data in driver 17 and sense amplifier 27 via data line 50. Data in driver 17 receives data in signals from data in buffer 18 which in turn receives them from data I/O pad 19. Buffer 18 latches the data in signals DI in response to signal DIL switching to a logic high. Driver 17 has an input connected to Vpp in order to provide signal DI at the required programming levels to array 24 via column decoder 26. Sense amplifier 27, when intelligent read signal IR is a logic high, senses the data provided to data line 50 by array 24 via column decoder 26. Sense amplifier 27, in response to sensing data, provides output signal DO to output buffer 28 an comparator 31. Output buffer 28, when a signal RC is received thereby at a logic high, provides signal DO from sense amplifier 27 to pad 19. Signal RC at a logic high is indicative of memory 10 being in a read mode.

Control latch 34 receives mode control signals G, W, and E from pads 36, 37, and 38, respectively. A code for signals G, W, and E has been devised for indicating which of the modes of memory 10 is to be entered. This coding is known in the art. For more details in this regard see U.S. Pat. No. 4,412,309, Kuo, entitled "EEPROM With Bulk Zero Program capability, issued Oct. 25, 1983. Control latch 34 provides internal control signals Gi, Wi, and Ei to logic 32 according to the logic state of signals G, W, and E. Control logic circuit 32 receives and interprets signals Gi, Wi, and Ei. When logic 32 interprets the logic states of signals Gi, Wi, and Ei as a byte write mode request, logic 32 switches signal RCL to a logic low causing latch 34 to latch signals G, W, and E. Control logic 32, comprised of conventional logic gates and timers, provides a signal READY/*BUSY to pad 33 at a logic high to indicate that memory 10 is ready to respond to a command from signals G, W, and E. When memory 10 is in a mode in which signals G, W, and E are latched, and/or the address latched, control logic 32 generates signal READY/*BUSY at a logic low. At the termination of such a mode, control logic 32 switches signal READY/*BUSY to a logic high.

Figure 2:
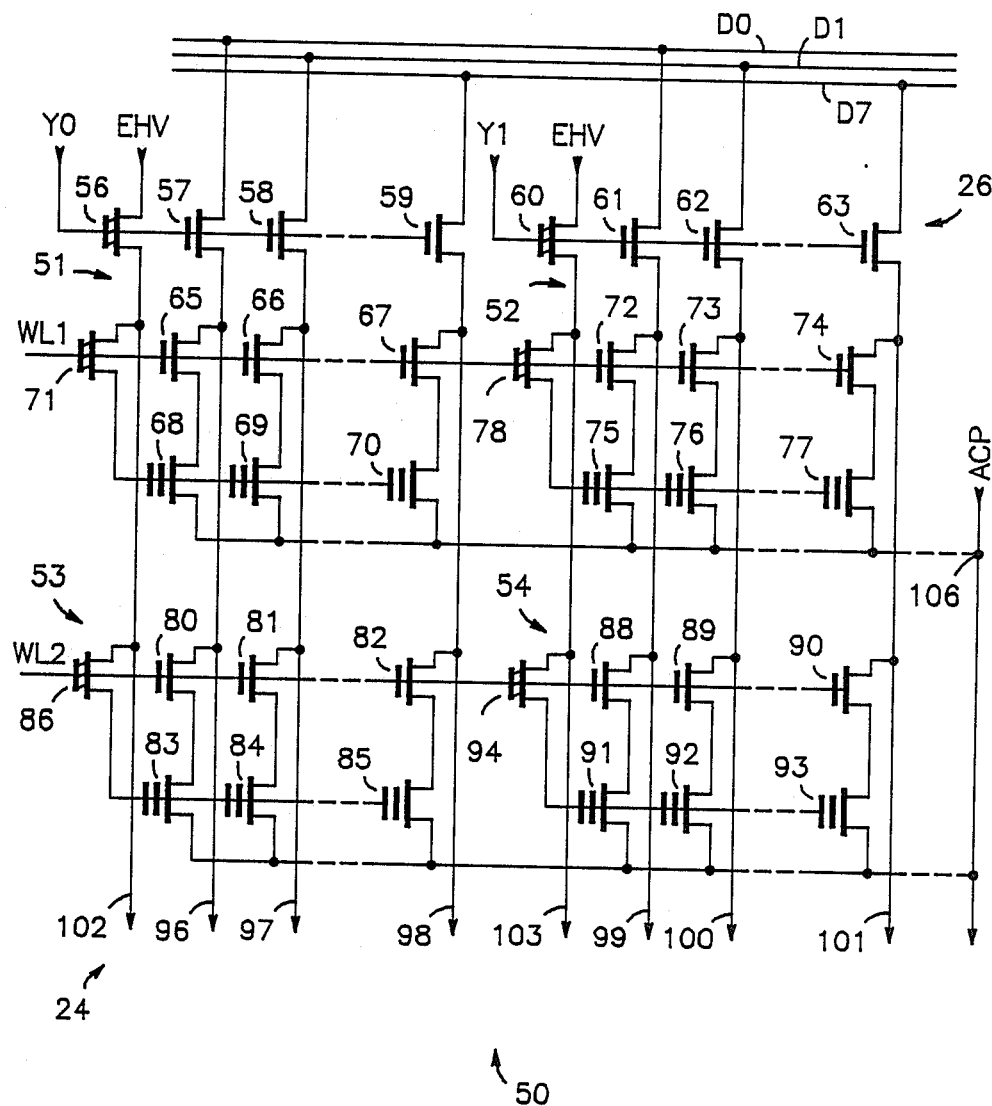
FIG. 2 is a circuit diagram of a portion of an array portion of memory 10 which is known in the art but is helpful in understanding the invention.

Portions of array 24, column decoder 26 and data line 50 are shown in FIG. 2. Shown in FIG. 2 are portions of four bytes 51, 52, 53, and 54 of array 24. Three data lines D0, D1, and D7 are shown in FIG. 2 for data line 50. Data line 50 comprises 8 different individual data lines in order to carry a full byte of data. In FIG. 2 column decoder 26 has transistors 56–63. As shown in FIG. 2, bytes 51–54 each have three coupling transistors, three floating gate transistors, and one control transistor, whereas each byte actually has 5 more floating gate transistors and 5 more coupling transistors. Bytes 51–54 are described herein with respect to the transistors shown in FIG. 2. Byte 51 comprises coupling transistors 65, 66, and 67; floating gate transistors 68, 69, 70; and control transistor 71. Byte 52 comprises coupling transistors 72, 73, and 74; floating gate transistors 75, 76, and 77, and control transistor 78. Byte 53 comprises coupling transistors 80, 81, and 82; floating gate transistors 83, 84, and 85; and control transistor 86. Byte 54 comprises coupling transistors 88, 89, and 90; floating gate transistors 91, 92, and 93; and control transistor 94. Array 24 is shown in FIG. 2 as including bit lines 96, 97, 98, 99, 100, and 101; erase lines 102 and 103; and word lines WL1 and WL2. Bytes 51 and 53 are connected to bit lines 96–98 and erase line 102, and bytes 52 and 54 are connected to bit lines 99–101 and erase line 103. Word line WL1 is connected to bytes 51 and 52. Word line WL2 is connected to bytes 53 and 54. All of the sources of floating gate transistors 68–70, 75–77, 83–85, and 91–93 are connected to a node 106 which is controlled by an array control program signal ACP. Signal ACP is at ground during a read or erase cycle and at a voltage near the voltage at a power supply terminal VDD which receives the power supply voltage during a program cycle. The power supply voltage can be, for example, 5 volts.

When a word line is enabled, the control transistor of each byte connected to the enabled word line couples the erase line to the gates of the floating gate transistors of that byte. Column decoder erase transistors 56 and 60 receive signals Y0 and Y1, respectively. Transistors 56 and 60 are depletion transistors so that they will conduct signal EHV to erase lines 102 and 103, respectively, for small voltages of EHV even when signals Y0 and Y1 are a logic low. Consequently, the erase lines such as lines 102 and 103 are a logic low when signal EHV is a logic low. Signal EHV is a logic low except when an erase is to be performed. In the program and read modes, signal EHV is at ground. Control transistors 71, 78, 86, and 94 are also depletion transistors. Consequently, the erase line voltage is coupled to the gates of all of the floating gate transistors for low voltages of the erase lines. All of the erase lines are a logic low except when signal EHV is at the high voltage of about 20 volts. For read and program modes, the gates of the floating gate transistors are grounded.

A byte is read by enabling the word line to which the byte is connected and coupling the bit lines to which the byte is connected to data line 50. To select byte 54, word line WL2 is enable by switching it to a logic high. This causes coupling transistors 88-90 to couple the drains of floating gate transistors 91-93 to bit lines 99-101, respectively. Bit lines 99, 100, and 101 are coupled to data lines D0, D1, and D7, respectively, in response to signal Y1 switching to a logic high. Floating gate transistors 91-93 are thus coupled to data line 50 where the conductivity state of the floating gate transistors can be sensed by sense amplifier 27. Floating gate transistors are in either a high or low threshold voltage state. The high threshold state causes a floating gate transistor to be non-conductive. The threshold voltage of a floating gate transistor in the high threshold state is around 5 volts which is well above ground which is the voltage on the gate of the floating gate transistor. The threshold voltage of a floating gate transistor in the low threshold state is about −5 volts. Consequently, a floating gate transistor in the low threshold state is conductive. The enabling of word line WL2 and the switching of signal Y1 to a logic high selects byte 54 for reading.

To program byte 54, however, requires higher voltages than to read byte 54. To program a floating gate transistor, a high voltage is applied to the drain while the gate and source are grounded. Byte 54 is programmed by enabling word line WL2 with a high voltage while providing signal Y1 at high voltage. The actual programming is achieved by application of the high voltage to the drain of the floating gate transistor to be programmed. Not all of the floating gate transistors of a selected byte are likely to be programmed. Before programming occurs, all of the floating gate transistors of the selected byte must first be in the erased state. The erased state is the high threshold state and is read as a logic high. Only the floating gate transistors which are to be a logic low are programmed. The floating gate transistors which are to remain in the logic high state are not programmed. The floating gate transistors which are to remain in the logic high state receive ground while the floating gate transistors which are to be programmed receive the high voltage. Such high voltage is coupled to the particular floating gate transistor from data line 50 via the column decoder transistors and the coupling transistors of the byte. If floating gate transistor 92 is to be programmed, data line D1 is brought to a high voltage by data in driver 17 shown in FIG. 1. In order for the high voltage on data line D1 to reach floating gate 92, column decoder transistor 62 and coupling transistor 73 must receive a sufficiently high gate voltage to pass the high voltage to floating gate transistor 92. Thus for programming a byte, the row decoder, which drives the word line, and the column decoder must receive a high voltage. Row decoder 23 enables the selected word line. The required high voltage is supplied by row decoder high voltage generator 13. The high voltage required by column decoder 26 is supplied by column decoder high voltage generator 16.

High voltage is also required for erase. To erase a floating gate transistor, high voltage is applied to the control gate while the source and drain are coupled to ground. Byte 94 is selected to be erased in the same way as it is selected to be programmed. The differences are that data line 50 is grounded, signal EHV is at the high voltage of about 20 volts, and signal ACP brings node 106 to ground. Signal Y1 must be at the high voltage in order to adequately couple the high voltage of signal EHV to erase line 103. Word line WL2 must be at the high high voltage in order to adequately couple the high voltage on erase line 103 to the gates of floating gate transistors 91-93. With word line WL2, signal EHV, and signal Y1 at the high voltage, and data line 50 and signal ACP at ground, byte 54 is erased so that floating gate transistors 91-93 are in the high threshold state which is interpreted to be a logic high.

Figure 3:
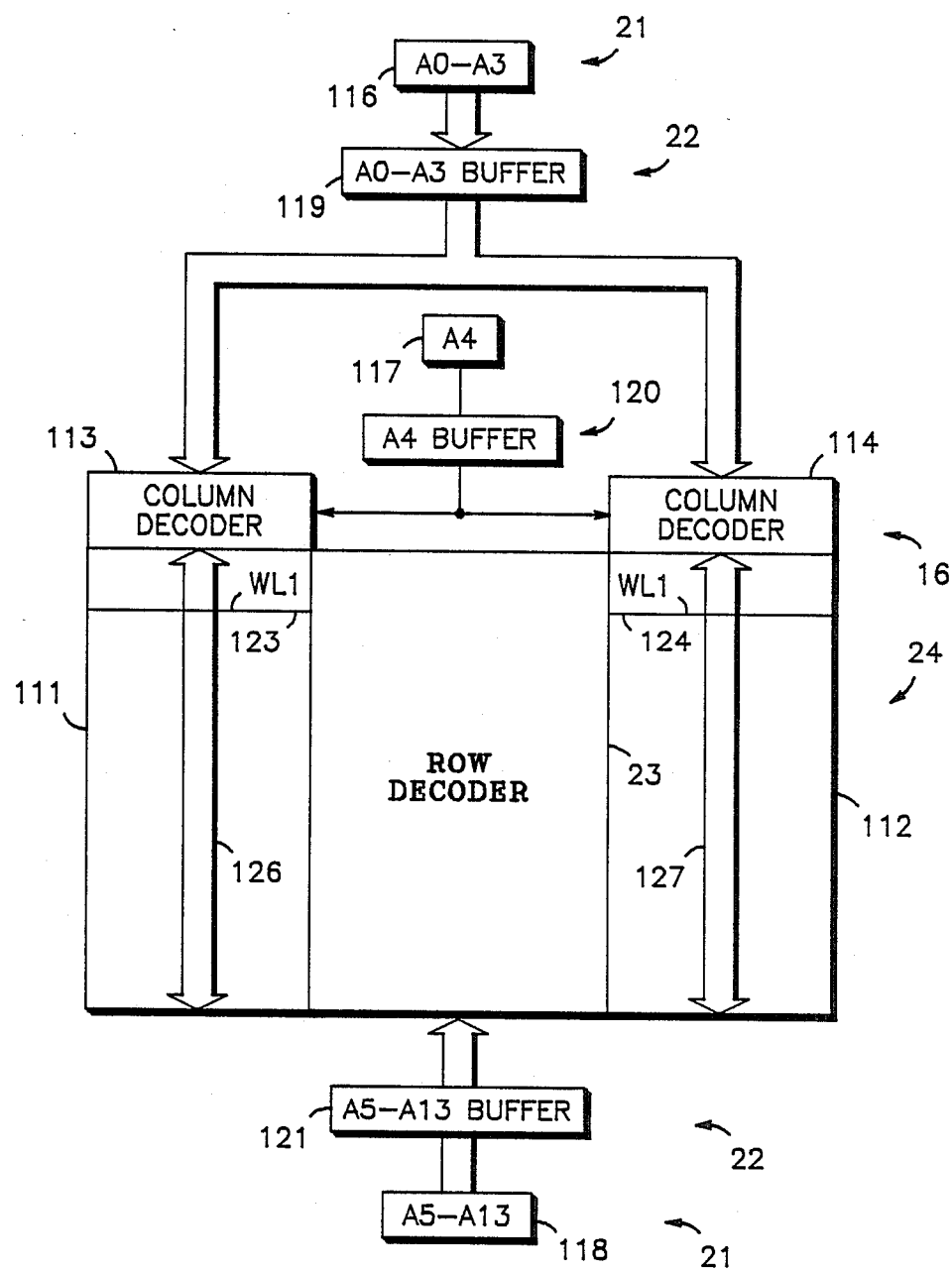
FIG. 3 is a layout of a portion of the memory of FIG. 1 according to a preferred embodiment of the invention.

Shown in FIG. 3 is array 24, column decoder 16, and row decoder 23 in layout form. Array 24 is divided into two portions, a left portion 111, and a right portion 112. Row decoder 23 is between left potion 111 and right portion 112. Column decoder 16 is also divided into two potions, a left portion 113 and a right portion 114. Left portion 113 of decoder 16 is coupled to and is above left portion 111 of array 24. Right portion 114 of decoder 16 is coupled to and is above right portion 112 of array 24. Also shown in FIG. 3 are three portions which comprise address pads 21 and three portions which comprise address buffer 22. The three portions of pads 21 are pads 116 for receiving address signals A0, A1, A2, and A3; pad 117 for receiving signal A4; and pads 118 for receiving address signals A5, A6, A7, A8, A9, A10, A11, A12, and A13. The three portions of buffer 22 are buffer 119 for receiving signals from pads 116, buffer 120 for receiving the signal from pad 117, and buffer 121 for receiving the signals from pads 118. Also shown in FIG. 3 is word line WL1 which extends from row decoder 23 across both left array portion 111 and right array portion 112. There are a total of 512 word lines which extend from row decoder 23 across both left array portion 111 and right array portion 112. Each word line has a left portion which crosses left array portion 111 and a right portion which crosses right array portion 112. In the case of word line WL1, there is a left portion 123 and right portion 124. One of the word lines is selected by address signals A5-A13. Row decoder 23 performs a one 512 selection as determined by address signals A5-A13. There are 16 bit line sets for each half of array 24. Each bit line set is comprised of 8 bit lines and a corresponding erase line. Shown in FIG. 3 is a bit line set 126 running down left array 111 from column decoder 113 a bit line set 127 running down right array 112 from column decoder 114.

Figure 4:
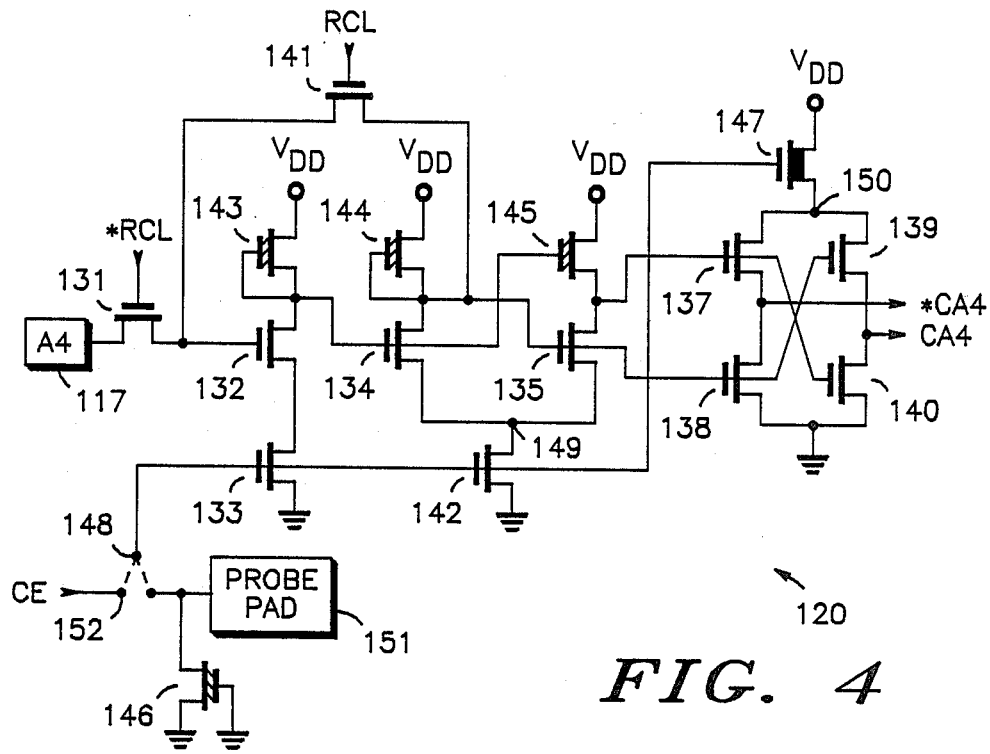
FIG. 4 is a circuit diagram of a portion of the layout shown in FIG. 3.

One of column decoders 113 and 114 is activated by address signal A4. The activated column decoder of decoders 113 and 114 performs a one of 16 decode to select one of the bit line sets as determined by address signals A0-A3. Memory 10 can be programmed to provide a high endurance 64K EEPROM of 65,536 bits arranged as 8,192 bytes and generally known as a 8K×8 EEPROM. This is achieved by programming buffer 120 to enable both column decoders 113 and 114 instead of enabling only one of them as determined by address signal A4. Shown in FIG. 4 is A4 buffer 120 and A4 pad 117. Buffer 120 is comprised of enhancement transistors 131, 132, 133, 134, 135, 136, 137, 138, 139, 140, 141 and 142; depletion transistors 143, 144, 145, and 146; and natural transistor 147. The enhancement transistors have a threshold voltage in the range of 0.4 to 0.8 volt. The depletion transistors have a threshold voltage in the range of −3 volts to −4 volts. The natural transistor has a threshold voltage in the range of 0.0 to 0.3 volt.

Transistor 131 has a first current electrode connected to pad 117, a control electrode for receiving a signal *RCL which is complementary to signal RCL provided by logic 32 shown in FIG. 1, and a second current electrode. Transistor 131 takes advantage of the bilateral nature of insulated gate field effect transistors. Transistor 132 has a gate connected to the second current electrode of transistor 131, a source, and a drain. Transistor 133 has a drain connected to the source of transistor 132, a source connected to ground, and a gate connected to a node 148. Transistor 143 has a gate and a source connected to the drain of transistor 132, and a drain connected to VDD, a positive power supply terminal for receiving, for example, 5 volts. Transistor 134 has a gate connected to the drain of transistor 132, a source connected to a node 149, and a drain. Transistor 142 has a drain connected to node 149, a gate connected to node 148, and a source connected to ground. Transistor 144 has a gate and a source connected to the drain of transistor 134, and a drain connected to VDD. Transistor 141 has a first current electrode connected to the gate of transistor 132, a control electrode for receiving signal RCL, and a second current electrode connected to the drain of transistor 134. Transistor 135 has a gate connected to the drain of transistor 134, a source connected to node 149, and a drain. Transistor 145 has a source connected to the drain of transistor 135, a gate connected to the drain of transistor 132, and a drain connected to VDD. Transistor 147 has a gate connected to node 148, a drain connected to VDD, and a source connected to a node 150. Transistor 137 has a gate connected to the drain of transistor 135, a drain connected to node 150, and a source. Transistor 138 has a drain connected to the source of transistor 137 for providing a complementary address control signal *CA4, a gate connected to the drain of transistor 134, and a source connected to ground. Transistor 139 has a gate connected to the drain of transistor 134, a drain connected to node 150, and a source. Transistor 140 has a drain connected to the source of transistor 139 for providing address control signal CA4, a gate connected to the drain of transistor 135, and a source connected to ground. Transistor 146 has a drain connected to a probe pad 151, and a source and a gate connected to ground. A node 152 receives chip enable signal CE.

When memory 10 is a 16KX8 EEPROM, node 148 is connected to node 152 so that transistors 133, 142, and 147 receive signal CE. When signal CE is a logic high, indicative of memory 10 being active, transistors 133, 142, and 147 are conductive. With transistors 133, 142, and 147 conductive, signals CA4 and *CA4 are responsive to and representative of the logic state of address signal A4 provided to the gate of transistor 132. The logic state present on pad 117 is coupled to the gate of transistor 132 when signal *RCL is a logic high. When signal *RCL is a logic low and signal RCL is a logic high, buffer 120 is in a latched state so that the logic state present on pad 117 when signal RCL switches to a logic high is latched. When signal CE is a logic low, transistors 133, 142, and 147 are non-conductive which blocks any current path between VDD and ground of buffer 120. With transistor 142 non-conductive, the drains of transistors 134 and 135 are a logic high which causes transistors 138 and 140 to be conductive. With transistors 138 and 140 both conductive, signals CA4 and *CA4 are a logic low. Transistors 137 and 139 are also conductive, but because transistor 147 is non-conductive, there is no deleterious effect of this.

When memory 10 is an 8KX8 EEPROM, node 148 is connected to the drain of transistor 146 and probe pad 151. Transistor 146 provides a resistive path to ground which causes transistors 133, 142, and 147 to be non-conductive. This is the same as signal CE being a logic low in the 16K×8 situation so that both signals *CA4 and CA4 are a logic low. The logic low state of signals *CA4 and CA4 is the state which causes the column decoder to which they are coupled to be active. Consequently, both column decoders 113 and 114 are active when signals CA4 and *CA4 are a logic low. Two bit line sets, one from the left array portion 111 and one from the right array portion 112 are selected as determined by address signals A0-A3. Two bytes are thus selected for each address. For the 16K×8 EEPROM situation, 14 address signals, signals A0-A13, are required to determined which one of the 16K bytes is selected. In the 8K×8 EEPROM situation, only 13 address signals are required to specify the selected byte. Signal A4 is not required because signal A4 is used to choose between left array portion 111 and right array portion 112. In the 8KX8 situation, buffer 120 is programmed to cause the selection of both left array portion 111 and right array portion 112 by activating both column decoders 113 and 114. The user of an 8K×8 EEPROM is thus required to supply signals A0-A12.

Memory 10 is intended for use in a package in which there are external leads which in turn are connected to bonding pads on memory 10. The user applies signals to the external leads of the package. In the 8K×8 situation, the user supplies signals A0-A12 to the external leads. The external lead which receives signal A4 is not bonded to pad 117 because buffer 120 is no longer responsive to any signal which may be present on pad 117. The lead which receives user supplied signal A4 is thus bonded to bonding pads 118 along with signals A5-A12. Buffer 121 receives user supplied signals A4-A12. In the 16KX8 situation, the 9 address signals which select the word line are user supplied address signals A5-A13 whereas in the 8K×8 situation, the 9 address signals which select the word line are user supplied signals A4-A12. In either the 16Kx8 or the 8K×8 situation, user supplied address signals A0-A3 are coupled to buffer 120 via pads 116 and are used to select the bit line set which is to provide data.

Probe pad 151 is to allow for testing of memory 10 as a 16K×8 memory even when memory 10 is programmed to be an 8K×8 memory. Transistor 146 provides a resistive path to ground so that the voltage at node 148 can be driven to a logic high by supply enough current to pad 151. With node 148 at logic high, circuit 120 responds to signals applied at pad 117 just as if chip enable signal CE were a logic high in the 16K×8 situation.

Figure 5:
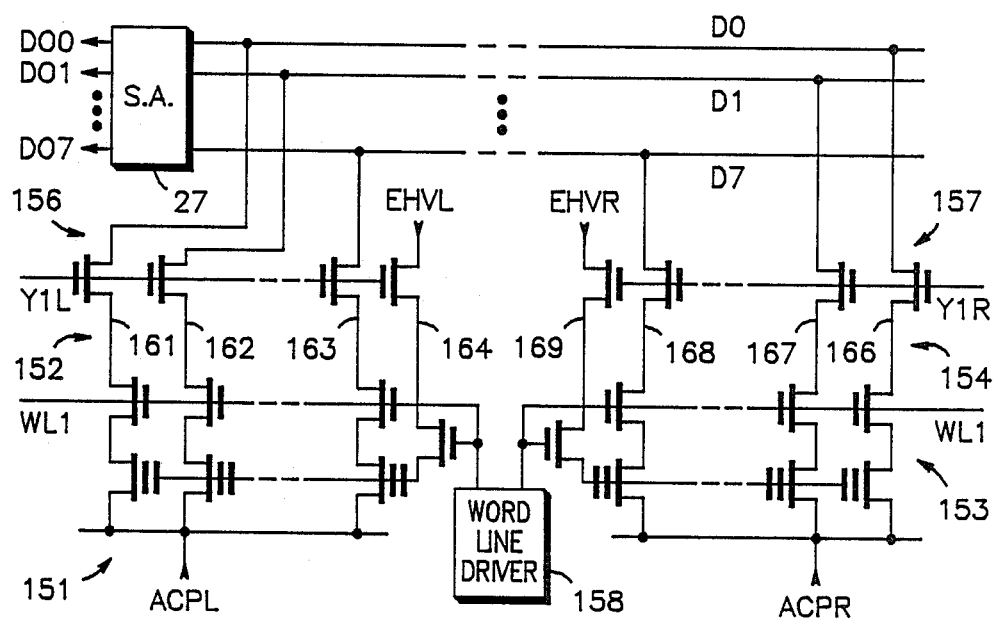
FIG. 5 is a circuit diagram of a portion of the memory of FIG. 1 according to a preferred embodiment of the invention.

Shown in FIG. 5 is a portion of memory 10 comprising a portion of a byte 151 and a bit line set 152 from left array 111; a portion of a byte 153 and bit line set 154 from right array 112; data lines D0, D1, and D7; word line WL2; sense amplifier 27; a portion of row decoder 23; a portion 156 of column decoder 113; and a portion 157 of column decoder 114. The left array 111 and right array 112 have their own array control program signals ACPL and ACPR. The portion of row decoder 23 shown in FIG. 5 is a word line driver 158 for enabling word line WL1. Bytes 151 and 153 are both enabled when word line WL1 is enabled. Word line WL1 is selected to be enabled by the 9 address signals received by buffer 121. The portion of bit line set 152 shown in FIG. 5 comprises bit lines 161, 162, and 163 and erase line 164. Bit line set 154 shown in FIG. 5 comprises bit lines 166, 167, and 168 and erase line 169. Left decoder portion 156 couples bit lines 161, 162, and 163 to data lines D0, D1, and D7, respectively, when a signal Y1L is a logic high. Signal Y1L is a logic high when bit line set 152 is selected by decoder 113 as determined by address signals A0-A3 and address signal A4. Right decoder portion 157 couples bit lines 166, 167, and 168 to data lines D0, D1, and D7, respectively, when a signal Y1R is a logic high. Signal Y1R is a logic high when bit line set 157 is selected as determined by address signals A0-A3 and address signal A4. Bytes 151 and 153 are selected by the same particular combination of address signals A0-A3. Every byte in left array 111 has such a corresponding pair in right array 112. The logic state of address signal A4 determines which one of signals Y1L and Y1R is the logic high which causes the data of the selected byte to be coupled onto data lines D0-D7. In the case of memory 10 being programmed to be a 64K EEPROM, address signal A4 is programmed to select both left array 111 and right array 112. In the 8KX8 situation, both signals Y1L and Y1R are a logic high. This causes both bytes 151 and 153 to supply data to data lines D0-D7.

In the case of an EEPROM bit, the failure mechanism related to endurance is the inability to hold charge in the floating gate. Positive charge held in the floating gate results in the floating gate transistor having the low threshold state and is thereby conductive. In the present embodiment the low threshold state results in the floating gate transistor of the memory cell having a negative threshold voltage which is a depletion state. If the floating gate cannot hold charge, the memory cell will degrade to the high threshold state and thereby become non-conductive. In the present embodiment the floating gate transistors having the high threshold have a positive threshold voltage and are enhancement type. Consequently, two EEPROM cells in the unprogrammed (erased) state coupled in parallel will not provide a conductive path even if one of them is no longer effective in storing data. Whereas, if both are programmed, a conductive path will be provided even though one of the EEPROM cells is no longer effective in storing data. Sense amplifier 27 provides output signals, as shown in FIG. 5, output signals DO0, DO1, and DO7 at a logic state corresponding to that coupled to corresponding data lines D0, D1, and D7. If either of the memory cells coupled to data line D1, for example, are conductive, sense amplifier 27 will provide signal DO1 at a logic low. If both of the memory cells coupled to data line D1 are non-conductive, sense amplifier 27 will provide signal DO1 at a logic high.

Byte 151 and 153 are coupled in parallel to provide a high endurance EEPROM when memory 10 is programmed to be an 8K×8 memory. By having the redundant byte pairs in different parts of the array, memory 10 can either be a 16K×8 EEPROM or a high endurance 8K×8 EEPROM. Another advantage of having the EEPROM cells which provide redundancy for each other being in separate parts of the array is that defects which might cover more than one memory cell do not effect both cells which form a pair.

I claim:
1. A memory comprising:
a first array of memory cells located at intersections of word lines and bit lines, wherein a memory cell is selected by the word line to which it is coupled being enabled and by the bit line to which it is coupled being coupled to a common data line;
a second array of memory cells located at intersections of word lines and bit lines, wherein a memory cell is selected by the word line to which it is coupled being enabled and by the bit line to which it is coupled being coupled to a common data line;
a row decoder, located between the first and second arrays for enabling a selected word line in the first array and in the second array in response to a first address; and
column decoder means for coupling a first bit line from the first array and a second bit line line from the second array to the common data line in response to a second address;
whereby a memory cell from the first array and a memory cell from the second array are simultaneously coupled to the common data line.
2. A memory comprising:
a first array of memory cells located at intersections of word lines and bit lines, wherein a memory cell is selected by the word line to which it is coupled being enabled and by the bit line to which it is coupled being coupled to a common data line;
a second array of memory cells located at intersections of word lines and bit lines, wherein a memory cell is selected by the word line to which it is coupled being enabled and by the bit line to which it is coupled being coupled to a common data line;
a row decoder, located between the first and second array, for enabling a selected word line in the first array and the second array in response to a first portion of an address;
first column decoder means for coupling, when enabled, a selected bit line from the first array to the common data line in response to a second portion of the address;
second column decoder means for coupling, when enabled, a selected bit line line from the second array to the common data line in response to the second portion of the address;
array selector means for selectively enabling the first and second column decoders in response to an array selector address signal; and
programming means for programming the array selector means to enable both of the column decoders independently of the array selector address signal;
whereby a memory cell from the first array and a memory cell from the second array are simultaneously coupled to the common data line when the array selector means has been programmed.
3. The memory of claim 2 wherein the array selector means provides a first array signal at a first logic state to the first column decoder to enable the first column decoder and the programming means causes the array selector means to provide the first array signal at a logic high when programmed.

4. The memory of claim 3 wherein the array selector means provides a second array signal at a first logic state to the second column decoder to enable the second column decoder and the programming means causes the array selector means to provide the second array signal at a logic high when programmed.

5. The memory of claim 4 further comprising test means for causing the array selector to selectively enable the first and second column decoders in response to the array selector signal after the array selector means has been programmed.

6. The memory of claim 5 wherein the decoder means comprises:
   row decoder means, located between the first and second arrays, for enabling a selected word line in the first array and in the second array as determined by a first address; and
   column decoder means for coupling a bit line from the first array and a bit line from the second array to the sense amplifier.

7. The memory of claim 2 further comprising test means for causing the array selector to selectively enable the first and second column decoders in response to the array selector signal after the array selector means has been programmed.

8. An electrically erasable programmable read only memory having memory cells selectively programmed to a low threshold state or unprogrammed to a high threshold state, comprising:
   a first array of memory cells located at intersections of word lines and bit lines;
   a second array of memory cells located at intersections of word lines and bit lines;
   sense amplifier means for receiving an input from a memory cell and for providing an output signal at a logic state representative thereof;
   address responsive means for coupling a selected memory cell from one of the first and second arrays to the sense amplifier in response to an address; and
   programming means for programming the address responsive means to simultaneously couple a selected memory cell from both the first array and the second array to the sense amplifier.

9. In an electrically erasable programmable read only memory having memory cells selectively programmed to a low threshold state or unprogrammed to a high threshold state and divided into first and second arrays of memory cells, a method for reading high reliability data from the memory comprising the steps of:
   selecting a first memory cell from the first array and a second memory cell from the second array in response to an address;
   coupling the memory cell selected from the first array to a common data line;
   coupling the memory cell selected from the second array to the common data line and
   providing an output signal at a first logic state if both of the selected memory cells are in the high threshold state and at a second logic state if either of the selected memory cells are in the low threshold state.

* * * * *